(12) United States Patent
Yim et al.

(10) Patent No.: US 12,245,525 B2
(45) Date of Patent: Mar. 4, 2025

(54) ELECTRONIC DEVICE AND METHOD FOR FABRICATING THE SAME

(71) Applicant: SK hynix Inc., Icheon (KR)

(72) Inventors: So Young Yim, Icheon (KR); Jeong Soo Kim, Icheon (KR); Geun Hyeok Jang, Icheon (KR)

(73) Assignee: SK hynix Inc., Icheon (KR)

( * ) Notice: Subject to any disclaimer, the term of this patent is extended or adjusted under 35 U.S.C. 154(b) by 493 days.

(21) Appl. No.: 17/542,177

(22) Filed: Dec. 3, 2021

(65) Prior Publication Data

US 2022/0399498 A1  Dec. 15, 2022

(30) Foreign Application Priority Data

Jun. 14, 2021 (KR) .................. 10-2021-0076570

(51) Int. Cl.
*H10N 70/00* (2023.01)
*G06F 3/06* (2006.01)
*G11C 13/00* (2006.01)
*H10B 63/10* (2023.01)

(52) U.S. Cl.
CPC ......... *H10N 70/011* (2023.02); *G06F 3/0604* (2013.01); *G06F 3/0659* (2013.01); *G06F 3/0673* (2013.01); *G11C 13/0002* (2013.01); *H10N 70/801* (2023.02); *H10B 63/10* (2023.02)

(58) Field of Classification Search
CPC .... H10N 70/011; H10N 70/801; H10N 70/20; H10N 70/231; H10N 70/826; H10N 70/8828; H10N 70/8833; G06F 3/0604; G06F 3/0659; G06F 3/0673; H10B 63/00; H10B 63/24; H10B 63/80; H10B 63/22; H10B 51/00; H10B 61/00; G11C 11/161; G11C 5/06; G11C 13/0002; H01L 21/0217; H01L 21/28247; H01L 21/76856
See application file for complete search history.

(56) References Cited

U.S. PATENT DOCUMENTS

| | | | |
|---|---|---|---|
| 10,950,731 B1* | 3/2021 | Peng | H01L 29/0653 |
| 2007/0132054 A1* | 6/2007 | Arghavani | H01L 29/7883 |
| | | | 257/E21.422 |
| 2015/0155173 A1* | 6/2015 | Hirota | H01L 29/4983 |
| | | | 438/682 |
| 2015/0255388 A1* | 9/2015 | Clevenger | H01L 21/76829 |
| | | | 438/618 |
| 2017/0092857 A1* | 3/2017 | Hausmann | H10N 70/231 |
| 2020/0066987 A1* | 2/2020 | Sims | C23C 16/4554 |
| 2020/0111954 A1* | 4/2020 | Kim | H10N 70/8836 |
| 2020/0127189 A1* | 4/2020 | Liao | H10N 70/8836 |
| 2020/0152870 A1* | 5/2020 | Lin | H10N 70/8828 |
| 2020/0194667 A1* | 6/2020 | Park | H10N 70/8828 |

(Continued)

FOREIGN PATENT DOCUMENTS

| | | |
|---|---|---|
| KR | 1020070116923 A | 12/2007 |
| KR | 1020200022154 A | 3/2020 |

*Primary Examiner* — Victor A Mandala

(57) ABSTRACT

An electronic device comprises a semiconductor memory that includes: a memory cell; a protective layer disposed along a profile of the memory cell; and a buffer layer interposed between at least a portion of a sidewall of the memory cell and the protective layer, wherein the buffer layer and the protective layer include silicon nitride, and wherein a density of the protective layer is greater than a density of the buffer layer.

29 Claims, 7 Drawing Sheets

(56) References Cited

U.S. PATENT DOCUMENTS

| | | | |
|---|---|---|---|
| 2020/0226133 A1* | 7/2020 | Li | G06F 16/2465 |
| 2021/0083091 A1* | 3/2021 | Peng | H01L 29/785 |
| 2021/0202735 A1* | 7/2021 | Peng | H01L 21/02211 |
| 2022/0189993 A1* | 6/2022 | Tirukkonda | H10B 41/10 |
| 2022/0320429 A1 | 10/2022 | Narayanan | H10N 70/8833 |
| 2022/0336742 A1* | 10/2022 | Lee | H10B 63/24 |

* cited by examiner

| Cycle | Feed 1 | Feed 2 | Purge 1 | TRT | Purge 2 |
|---|---|---|---|---|---|
| silicon source gas(SiH4) | | | | | |
| reactive gas(NH3) | | | | | |
| treatment gas(N2/He) | | | | | |
| RF Power | | | | | |

ELECTRONIC DEVICE AND METHOD FOR FABRICATING THE SAME

CROSS-REFERENCE TO RELATED APPLICATION

This application claims priority under 35 U.S.C. § 119 to Korean Patent Application No. 10-2021-0076570 filed on Jun. 14, 2021, which is incorporated herein by reference in its entirety.

BACKGROUND

1. Technical Field

This patent document relates to memory circuits or devices and their applications in electronic devices or systems.

2. Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc. In such semiconductor devices, as a memory cell is smaller, there may occur leaning of the memory cell during the fabrication thereof.

SUMMARY

The disclosed technology in this patent document includes various embodiments of an electronic device including a semiconductor memory which is capable of improving characteristics of a memory cell and preventing leaning of the memory cell, and a method for fabricating the same.

In an embodiment, an electronic device includes a semiconductor memory that includes: a memory cell; a protective layer disposed along a profile of the memory cell; and a buffer layer interposed between at least a portion of a sidewall of the memory cell and the protective layer, wherein the buffer layer and the protective layer include silicon nitride, and wherein a density of the protective layer is greater than a density of the buffer layer.

In another embodiment, a method for fabricating an electronic device comprising a semiconductor memory includes: forming a memory cell over a substrate; forming a buffer layer over at least a portion of a sidewall of the memory cell; and forming a protective layer along a profile of the memory cell on which the buffer layer is formed, wherein the buffer layer and the protective layer include silicon nitride, and wherein a density of the protective layer is greater than a density of the buffer layer.

DETAILED DESCRIPTION

Figures 1, 2:
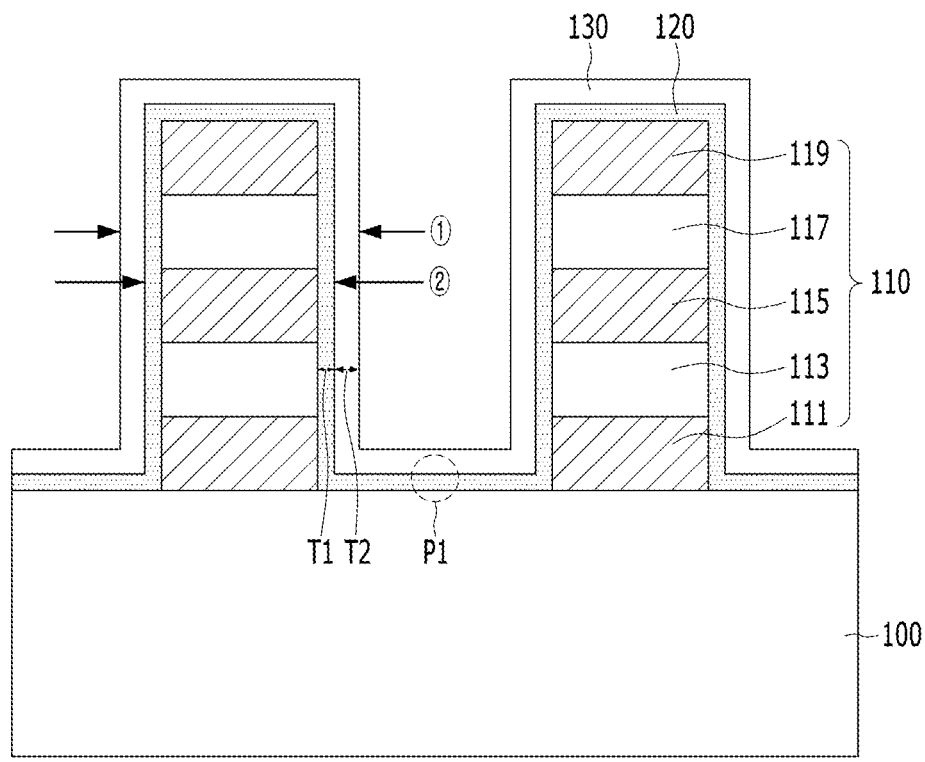
FIG. 1 is a cross-sectional view illustrating a memory device according to an embodiment of the present disclosure.
FIG. 2 shows one cycle of a process of forming a buffer layer according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a memory device according to an embodiment of the present disclosure.

Referring to FIG. 1, the memory device may include a substrate 100, a memory cell 110 disposed over the substrate 100, a protective layer 130 disposed over the memory cell 110, and a buffer layer 120 interposed between the protective layer 130 and the memory cell 110.

The substrate 100 may include a semiconductor material such as silicon. A required lower structure (not shown) may be formed in the substrate 100. For example, the substrate 100 may include a driving circuit (not shown) to drive the memory cell 110.

The memory cell 110 may have a pillar shape and function to store data. For example, the memory cell 110 may include a variable resistance element that stores different data by switching between different resistance states according to a voltage or current applied through its upper end and lower end. Furthermore, for example, the memory cell 110 may include a multi-layered structure including a lower electrode layer 111, a selection element layer 113, an intermediate electrode layer 115, a variable resistance layer 117, and an upper electrode layer 119.

The lower electrode layer 111 and the upper electrode layer 119 may be respectively located at the lower end and the upper end of the memory cell 110 to transmit a voltage or current required for an operation of the memory cell 110. The intermediate electrode layer 115 may be interposed between the selection element layer 113 and the variable resistance layer 117, and may function to electrically connect the selection element layer 113 and the variable resistance layer 117 while physically separating them from each other. One or more of the lower electrode layer 111, the intermediate electrode layer 115, and the upper electrode layer 119 may include one of various conductive materials including a metal such as platinum (Pt), tungsten (W), aluminum (Al), copper (Cu), or tantalum (Ta), a metal nitride such as titanium nitride (TiN) or tantalum nitride (TaN), and a combination thereof. Alternatively, one or more of the lower electrode layer 111, the intermediate electrode layer 115, and the upper electrode layer 119 may include a carbon electrode.

The selection element layer 113 may function to prevent current leakage that may occur between memory cells 110 sharing a line. To this end, the selection element layer 113 may have a threshold switching characteristic, that is, a characteristic for blocking or substantially limiting a current flowing therethrough when a magnitude of a voltage applied thereto is less than a predetermined threshold value and for allowing a current flowing therethrough to abruptly increase when the magnitude of the voltage applied thereto is equal to or greater than the threshold value. The threshold value may be referred to as a threshold voltage. The selection element layer 113 may be implemented in a turn-on state or a turn-off state based on the threshold voltage. The selection element layer 113 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap, such as $SiO_2$, $Al_2O_3$, or the like. In particular, the OTS material used as the selection element layer 113 may contain germanium (Ge), silicon (Si), arsenic (As), tellurium (Te), or a combination thereof, and may further contain selenium (Se), sulfur (S), carbon (C), nitrogen (N), indium (In), boron (B), or the like. For example, the OTS material may include AsTeGeSiIn, GeTe, SnTe, GeSe, SnSe, AsTeGeSiSbS, AsTeGeSiInP, AsTeGeSi, AsTeGeSiSeNS, AsTeGeSiP, AsTeAsSe, AsGeSe, AsTeGeSe, GeTSe, SeTe, GeTeSe, GeSiCSe, GSiTe, GeSiTePb GeAsBiTe, GeAsBiSe, or the like.

The variable resistance layer 117 may be a part that stores data in the memory cell 110. To this end, the variable resistance layer 117 may have a variable resistance characteristic of switching between different resistance states according to an applied voltage or current. The variable resistance layer 117 may have a single-layered structure or a multi-layered structure including at least one of materials used for an RRAM, a PRAM, an MRAM, an FRAM, or the like, that is, a metal oxide such as a perovskite-based oxide or a transition metal oxide, a phase change material such as a chalcogenide-based material, a ferromagnetic material, a ferroelectric material, or the like.

However, the layered structure of the memory cell 110 is not limited to the above-described embodiment. When the memory cell 110 includes a variable resistance element, as long as it includes the variable resistance layer 117 essential for data storage, the stacking order of the layers in the memory cell 110 may be changed and/or one or more of the stacked layers may be omitted. For example, one or more of the lower electrode layer 111, the intermediate electrode layer 115, and the upper electrode layer 119 may be omitted, or the positions of the selection element layer 113 and the variable resistance layer 117 may be reversed. Alternatively, one or more layers (not shown) may be added to the memory cell 110 for process improvement or property improvement of the memory cell 110.

The protective layer 130 may function to prevent impurities from penetrating into the memory cell 110 from the outside by encapsulating and protecting the memory cell 110. In particular, if impurities penetrate into the selection element layer 113 and the variable resistance layer 117, the characteristics of the memory cell 110 may be deteriorated. Therefore, the protective layer 130 may be formed to cover at least a sidewall of the selection element layer 113 and a sidewall of the variable resistance layer 117. For example, as shown, the protective layer 130 may be formed along a profile while covering a sidewall and an upper surface of the memory cell 130 and an upper surface of the substrate 100 with the buffer layer 120 interposed therebetween. The protective layer 130 may include silicon nitride.

The protective layer 130 may be formed by a deposition method that has excellent step coverage characteristics and can be performed at a relatively low temperature, for example, an Atomic Layer Deposition (ALD) method, so as to prevent state conversion of the selection element layer 113 and/or the variable resistance layer 117. Here, the low temperature may be equal to or lower than 300° C., and further, in a range of 150° C. to 300° C.

In addition, the protective layer 130 may be formed using plasma of a silicon source gas and a reactive gas including nitrogen. Here, $SiH_2I_2$ (diiodosilane, DIS) gas may be used as the silicon source gas because this gas may be decomposed at a low temperature, for example, in a temperature range of 150° C. to 300° C., which is an ALD process temperature, and may satisfy the step coverage characteristics required to form the protective layer 130 along the profile. As the reactive gas, for example, $N_2$ gas, $H_2N_2$ gas, or a combination thereof may be used.

In the case of the protective layer 130 formed by using the DIS gas as the silicon source gas, the number of Si—N bonds per unit volume in the protective layer 130 is relatively large and the protective layer 130 has a high density of about 2.9 g/cm³. Therefore, it may be possible to effectively prevent impurities from penetrating into the memory cell 110 from the outside. Furthermore, when the protective layer 130 has such a high density, compressive stress of the protective layer 130 may increase, so that leaning of the memory cell 110 may be reduced/prevented. The compressive stress of the protective layer 130 is indicated by arrow ① in FIG. 1.

However, when the DIS gas is used as the silicon source gas, impurities such as Cl, O, I, or the like, caused by the DIS gas may adversely affect the memory cell 110. For example, when the OTS material is used as the selection element layer 113 and the protective layer 130 is formed by using the DIS gas as the silicon source gas and formed on the sidewall of the selection element layer 113, the selection element layer 113 is deformed or defects such as voids are generated at an interface between the selection element layer 113 and the intermediate electrode layer 115. Therefore, in the present embodiment, the buffer layer 120 may be used in order to prevent such defects.

The buffer layer 120 may be interposed between the protective layer 130 and the memory cell 110 to prevent impurities due to the DIS gas used in the process of forming the protective layer 130 from penetrating into the memory cell 110. In particular, because the impurities due to the DIS gas cause deformation of the selection element layer 113 including the OTS material, the buffer layer 120 may be formed to surround at least the sidewall of the selection element layer 113 between the selection element layer 113 and the protective layer 130. The buffer layer 120 may include silicon nitride.

For example, as illustrated, the buffer layer 120 may be formed along a profile while covering the sidewall and the upper surface of the memory cell 130 and the upper surface of the substrate 100. Because the protective layer 130 is for blocking external impurities from affecting the memory cell 110 and the buffer layer 120 is for blocking impurities from affecting the memory cell 110 during the formation of the protective layer 130, a thickness T1 of the buffer layer 120 may be smaller than a thickness T2 of the protective layer 130.

The buffer layer 120 may be formed by a deposition method that has excellent step coverage characteristics and can be performed at a relatively low temperature, for example, a Chemical Vapor Deposition (CVD) method, so as to prevent state conversion of the selection element layer 113 and/or the variable resistance layer 117. Also, the buffer layer 120 may be formed by forming an initial silicon nitride layer using plasma of a silicon source gas and a reactive gas containing nitrogen, and then performing an additional plasma treatment on the initial silicon nitride layer. Here, $SiH_4$ gas may be used as the silicon source gas, and $NH_3$ gas may be used as the reactive gas. When the $SiH_4$ gas is used as the silicon source gas, impurities, such as Cl, O, I, or the like, may be absent. Accordingly, it may be possible to prevent impurities from penetrating into the memory cell 110, particularly into the selection element layer 113, during the formation of the buffer layer 120.

However, in the case of the initial silicon nitride layer formed by using the $SiH_4$ gas as the silicon source gas, the number of Si—N bonds per unit volume in the initial silicon nitride layer may be relatively small, whereas the number of imperfect bonds, such as Si—H bonds, N—H bonds, Si—N—H bonds, or the like, per unit volume in the initial silicon nitride layer may be relatively large, compared to those in the protective layer 130 formed by using the DIS gas as the silicon source gas. Therefore, it is confirmed that the initial silicon nitride layer has a low density of about 2.2 $g/cm^3$ and tensile stress. If the buffer layer 120 is formed of this initial silicon nitride layer without performing the additional plasma treatment, the tensile stress may cause the leaning of the memory cell 110. In the present embodiment, the buffer layer 120 having compressive stress may be obtained by transforming the initial silicon nitride layer having the tensile stress into a silicon nitride layer having the compressive stress by performing the additional plasma treatment on the initial silicon nitride layer. The compressive stress of the buffer layer 120 is indicated by an arrow ② in FIG. 1.

The method of forming the buffer layer 120 will be described in detail with reference to FIGS. 2 and 3A to 3E.

FIG. 2 shows one cycle of a process of forming the buffer layer 120 of FIG. 1 according to an embodiment of the present disclosure.

Referring to FIG. 2, a silicon source gas may be supplied into a chamber in which a substrate on which a memory cell is formed is disposed (refer to Feed1). As the silicon source gas, $SiH_4$ gas may be used.

Subsequently, while the silicon source gas is supplied into the chamber, a reactive gas including nitrogen may be supplied into the chamber and RF power may be applied to generate plasma of the silicon source gas and the reactive gas (refer to Feed2). As the reactive gas, $NH_3$ gas may be used. An initial silicon nitride layer may be formed from the plasma and deposited along a profile of a resultant structure including the substrate and the memory cell formed on the substrate.

Subsequently, a purge process may be performed to remove excessively supplied silicon source gas and reactive gas from the chamber (refer to Purge1).

Subsequently, a treatment gas including nitrogen and a light element may be supplied into the chamber and RF power may be applied to generate plasma of the treatment gas (refer to TRT). Therefore, the initial silicon nitride layer may be treated by the plasma of the treatment gas. Here, the treatment gas containing nitrogen may be $N_2$ gas, and the treatment gas containing the light element may be He gas. In this plasma treatment process, imperfect bonds, such as Si—H bonds, N—H bonds, Si—N—H bonds, or the like, existing in the initial silicon nitride layer may be broken by the treatment gas containing the light element, and then may be recombined into Si—N bonds. Therefore, the number of Si—N bonds included in the initial silicon nitride layer may be increased by the treatment gas containing nitrogen. As a result, a final silicon nitride layer with increased Si—N bonds and increased density may be obtained. It is confirmed that the density of the final silicon nitride layer is increased to about 2.7 $g/cm^3$. Although the Si—N bonds and/or the density of the final silicon nitride layer are increased, they may be less than the Si—N bonds and/or the density of the protective layer 130 of FIG. 1.

Subsequently, a purge process may be performed to remove excessively supplied treatment gas from the chamber (refer to Purge2).

The cycle of the process described above with reference to FIG. 2 may be repeated one or more times. That is, the buffer layer 120 including a single final silicon nitride layer may be formed by performing the cycle of the process one time, or the buffer layer 120 including a stacked structure of a plurality of final silicon nitride layers may be formed by repeatedly performing the cycle of the process a plurality of times.

FIGS. 3A to 3E are cross-sectional views illustrating a process of forming the buffer layer 120 by repeating the cycle of the process shown in FIG. 2 N times, where N is a natural number greater than or equal to 2. FIGS. 3A to 3E are enlarged views of a portion corresponding to a portion P1 of FIG. 1.

Figure 3A:
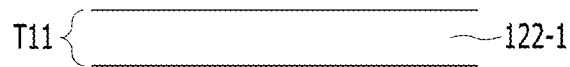
FIGS. 3A to 3E are cross-sectional views illustrating a process of forming the buffer layer by repeating the cycle of FIG. 2 N times.

Referring to FIG. 3A, a first initial silicon nitride layer 122-1 may be formed over a substrate. The first initial silicon nitride layer 122-1 may be formed using plasma of a silicon source gas including $SiH_4$ gas and a reactive gas including nitrogen. In particular, the first initial silicon nitride layer 122-1 may be formed by performing a process of supplying a silicon source gas (refer to Feed1 of FIG. 2) and a process of generating plasma of the silicon source gas and a reactive gas (refer to Feed2 of FIG. 2). A thickness of the first initial silicon nitride layer 122-1 is referred to as a first thickness T11.

Figure 3B:
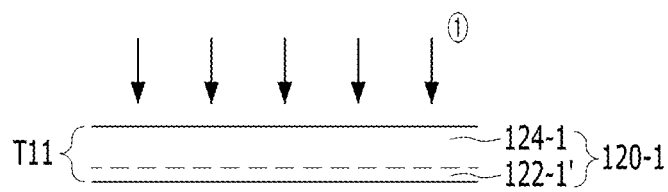

Subsequently, referring to FIG. 3B, a first final silicon nitride layer 120-1 may be formed by performing a first plasma treatment with a gas containing nitrogen and a light element on the first initial silicon nitride layer 122-1 (refer to arrow ①). The first plasma treatment may be performed by a plasma treatment process (refer to TRT of FIG. 2). A thickness of the first final silicon nitride layer 120-1 may be substantially the same as the first thickness T11.

In the present embodiment, a portion of the first initial silicon nitride layer 122-1 may be treated with plasma from its upper surface. The plasma-treated portion of the first initial silicon nitride layer 122-1 is referred to as a first treated portion 124-1, and the remaining portion without the plasma treatment is referred to as a first remaining portion 122-1'. The first treated portion 124-1 and the first remaining portion 122-1' may form the first final silicon nitride layer 120-1. However, because the purpose of the present embodiment is to secure the first treated portion 124-1, a thickness of the first treated portion 124-1 may be greater than a thickness of the first remaining portion 122-1'.

The first treated portion 124-1 may have increased Si—N bonds and increased density compared to the first initial silicon nitride layer 122-1 and the first remaining portion 122-1'. Si—N bonds and density of first remaining portion 122-1' may be substantially the same as those of the first initial silicon nitride layer 122-1. As a result, the first final silicon nitride layer 120-1 may also have increased Si—N bonds and increased density compared to the first initial silicon nitride layer 122-1.

Also, the first initial silicon nitride layer 122-1 and the first remaining portion 122-1' may have tensile stress, but the first treated portion 124-1 may have compressive stress. Because the thickness and/or a volume of the first treated portion 124-1 are greater than those of the first remaining portion 122-1', the first final silicon nitride layer 120-1 may have compressive stress.

Furthermore, although not shown, in another embodiment, the entire first initial silicon nitride layer 122-1 may be treated with the plasma from its upper surface. As a result, the first final silicon nitride layer 120-1 may include only the first treated portion 124-1 and may not include the first remaining portion 122-1'. The first treated portion 124-1 may have increased Si—N bonds, increased density, and compressive stress compared to the first initial silicon nitride layer 122-1, and consequently, the first final silicon nitride layer 120-1 may also have increased Si—N bonds, increased density, and compressive stress compared to the first initial silicon nitride layer 122-1.

The thickness and/or the volume of the first treated portion 124-1 may be increased according to an increase in a processing time of the plasma treatment, an increase in RF power, or the like.

Here, the first thickness T11 may be smaller than the aforementioned thickness of the buffer layer 120 (refer to T1 of FIG. 1). In this case, the cycle of the process shown in FIG. 2 may be repeated to obtain the buffer layer 120 having a desired thickness.

Figure 3C:
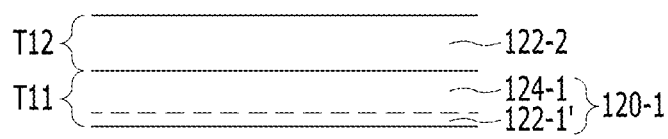

For example, referring to FIG. 3C, a second initial silicon nitride layer 122-2 may be formed over the first final silicon nitride layer 120-1. The process of forming the first initial silicon nitride layer 122-2 may be substantially the same as the process of forming the first initial silicon nitride layer 122-1. A thickness of the second initial silicon nitride layer 122-2 is referred to as a second thickness T12. The second thickness T12 may be substantially the same as the first thickness T11.

Figure 3D:
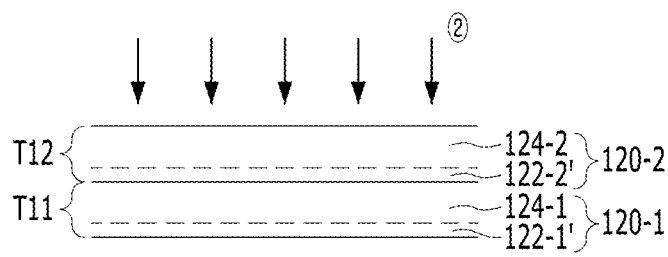

Subsequently, referring to FIG. 3D, a second final silicon nitride layer 120-2 may be formed by performing a second plasma treatment with a gas containing nitrogen and a light element on the second initial silicon nitride layer 122-2 (refer to arrow ②). The second plasma treatment process may be substantially the same as the first plasma treatment process. A thickness of the second final silicon nitride layer 120-2 may be substantially the same as the second thickness T12.

In the present embodiment, the second initial silicon nitride layer 122-2 may be partially treated with plasma from its upper surface, and thus, the second final silicon nitride layer 120-2 includes a second treated portion 124-2 and a second remaining portion 122-2'. However, in another embodiment, the entire second initial silicon nitride layer 122-2 may be treated with plasma, and thus, the second final silicon nitride layer 120-2 includes only the second treated portion 124-2. That is, the second initial silicon nitride layer 122-2 is fully converted into the second treated portion 124-2.

Here, the sum of the first thickness T11 and the second thickness T12 may be smaller than the above-described thickness of the buffer layer 120 (refer to T1 of FIG. 1). In this case, the cycle of the process shown in FIG. 2 may be further repeated to obtain the buffer layer 120 having the desired thickness.

Figure 3E:
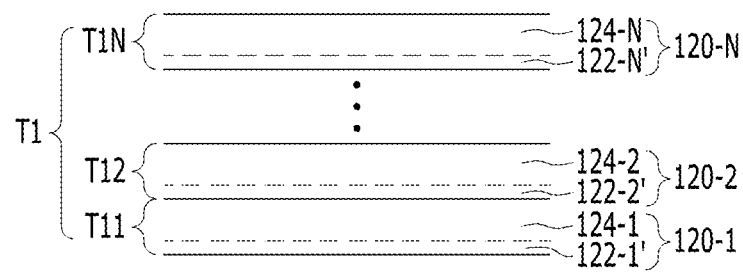

As a result, referring to FIG. 3E, a structure in which the first final silicon nitride layer 120-1 to an Nth final silicon nitride layer 120-N are stacked may be obtained. This stacked structure may form the buffer layer 120 of FIG. 1. When a thickness of the Nth final silicon nitride layer 120-N is referred to as a Nth thickness T1N, the sum of the first thickness T11 to the Nth thickness T1N may be substantially the same as the thickness of the buffer layer 120 (refer to T1 of FIG. 1).

In the present embodiment, the Nth final silicon nitride layer 120-N may be partially treated with plasma from its upper surface, and thus, the Nth final silicon nitride layer 120-N may include an Nth treated portion 124-N and an Nth remaining portion 122-N'. However, in another embodiment, the Nth final silicon nitride layer 120-N may include only the Nth treated portion 124-N.

Meanwhile, in the present embodiment, the additional plasma treatment is performed in every cycle of the CVD process, but the present disclosure is not limited thereto. If desired, the additional plasma treatment may be omitted in some cycles of the CVD process. For example, when the first final silicon nitride layer 120-1 closest to the memory cell 110 is formed, the first plasma treatment process may be omitted to minimize damage to the memory cell 110, and when the remaining final silicon nitride layers 120-2, . . . , and 120-N are formed, the second plasma treatment process to the Nth plasma treatment process may be performed, respectively. In this case, the first final silicon nitride layer 120-1 may be substantially the same as the first initial silicon nitride layer 122-1. That is, the first final silicon nitride layer 120-1 may have a smaller density and a smaller number of Si—N bonds per unit volume than each of the second to Nth final silicon nitride layers 120-2 to 120-N, and may have tensile stress. However, because the second to Nth final silicon nitride layers 120-2 to 120-N have compressive stress, the buffer layer including the first to Nth final silicon nitride layers 120-1 to 120-N may have compressive stress.

The advantages of the above-described memory device will be described as follows.

First, by forming the protective layer 130 by using the DIS gas as the silicon source gas, the penetration of external impurities into the memory cell 110 may be effectively prevented and the leaning of the memory cell 110 may be prevented.

In addition, by interposing the buffer layer 120 between the protective layer 130 and the memory cell 110, it may be possible to prevent impurities due to the DIS gas from penetrating into the memory cell 110.

In addition, even when the buffer layer 120 has tensile stress by using $SiH_4$ gas as the silicon source gas during the formation of the buffer layer 120, the buffer layer 120 may be changed to have compressive stress by performing the additional plasma treatment, thereby preventing the leaning of the memory cell 110.

In addition, because the additional plasma treatment is performed within the cycle of the CVD process, it may be facilitated to obtain the buffer layer 120 having a desired thickness and characteristics. If the additional plasma treatment is not performed within the cycle of the CVD process and is performed on a surface of an initial silicon nitride layer having a desired thickness after forming the initial silicon nitride layer, a plasma-treated portion, that is, a portion with increased density and compressive stress, may not be sufficiently obtained.

Furthermore, because the cycle for forming the buffer layer 120, that is, the forming process of the initial silicon nitride layer and the plasma treatment process, is performed in situ in the same chamber, the forming process of the buffer layer 120 may be facilitated and simpler. Furthermore, because the forming process of the buffer layer 120 and the forming process of the protective layer 130 may also be performed in situ in the same chamber, the processes may be facilitated and simpler.

As a result, a semiconductor memory capable of securing characteristics of the memory cell 110 and preventing the leaning of the memory cell 110 may be formed, and the forming process of the semiconductor memory may be facilitated and simpler.

Meanwhile, in the present embodiment, the buffer layer 120 is formed along the entire surface of the memory cell 110 and the protective layer 130 is formed along the entire surface of the buffer layer 120, but embodiments are not limited thereto. In another embodiment, the buffer layer 120 may be formed to partially cover the entire surface of the memory cell 110. For example, the buffer layer 120 may be formed to cover a portion of the entire surface of the memory cell 110, which is adversely affected by penetration of impurities generated during the formation of the protective layer 130. For example, the buffer layer 120 may be formed to cover a sidewall of the selection element layer 113 including the OTS material, but may be formed not to cover a sidewall of the variable resistance layer 117. This will be described exemplarily with reference to FIGS. 4 and 5.

Figure 4:
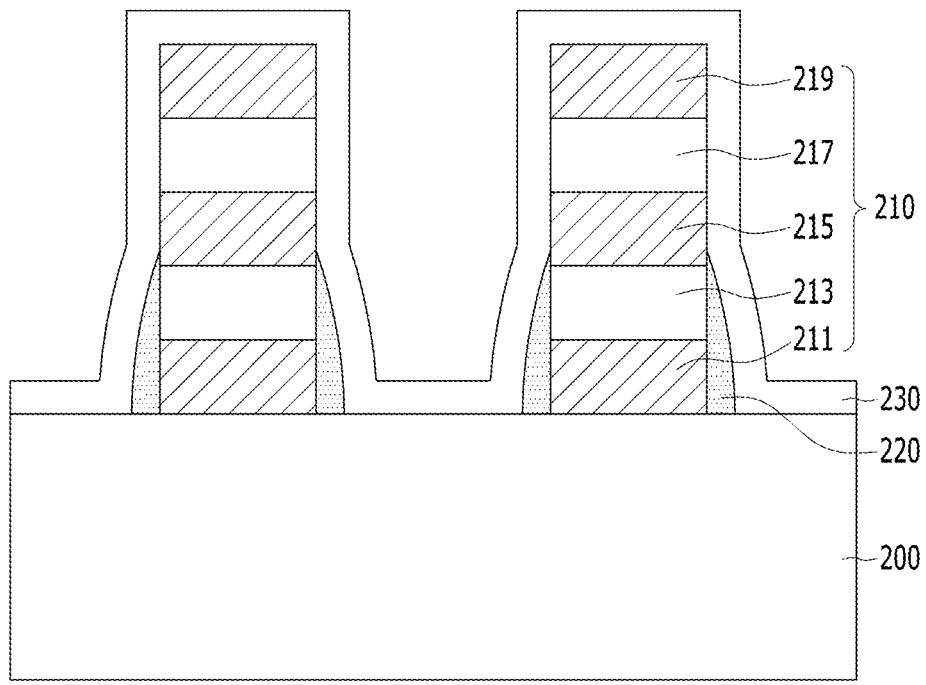
FIG. 4 is a cross-sectional view illustrating a memory device according to another embodiment of the present disclosure.

FIG. 4 is a cross-sectional view illustrating a memory device according to another embodiment of the present disclosure. Differences from the above-described embodiment will be mainly described.

Referring to FIG. 4, the memory device may include a substrate 200, a memory cell 210 disposed over the substrate 200, a protective layer 230 disposed over the memory cell 210, and a buffer layer 220 interposed between the protective layer 230 and a portion of a sidewall of the memory cell 210.

The memory cell 210 may include a stacked structure of a lower electrode layer 211, a selection element layer 213, an intermediate electrode layer 215, a variable resistance layer 217, and an upper electrode layer 219.

The buffer layer 220 may be formed to cover at least a sidewall of the selection element layer 213 of the memory cell 210.

In particular, the buffer layer 220 may be formed to have a spacer type and have a thickness and/or a horizontal width increasing from top to bottom while covering the sidewall of the selection element layer 213. The buffer layer 220 may be formed by repeating the cycle of the process shown in FIG. 2 along the entire surface of the substrate 200 on which the memory cell 210 is formed in order to form a silicon nitride layer, and then, performing a blanket etching process on the silicon nitride layer.

Because the buffer layer 220 covers at least the sidewall of the selection element layer 213, an upper end of the buffer layer 220 may be positioned at a height higher than or equal to an upper surface of the selection element layer 213. For example, as illustrated, the buffer layer 220 may cover a portion of a sidewall of the intermediate electrode layer 215, the sidewall of the selection element layer 213, and a sidewall of the lower electrode layer 211. However, embodiments are not limited thereto. In another embodiment, the height of the upper end of the buffer layer 220 may be variously changed as long as it is positioned between a height higher than or equal to the upper surface of the selection element layer 213 and a height lower than or equal to the upper surface of the memory cell 210.

The protective layer 230 may be formed along a profile of a resultant structure in which the buffer layer 220 is formed. Accordingly, the protective layer 230 may directly contact the remaining portion of the memory cell 210 that is not covered by the buffer layer 220. For example, as illustrated, the protective layer 230 may directly contact and cover the rest of the sidewall of the intermediate electrode layer 215, a sidewall of the variable resistance layer 217, and a sidewall and an upper surface of the upper electrode layer 219.

Figure 5:
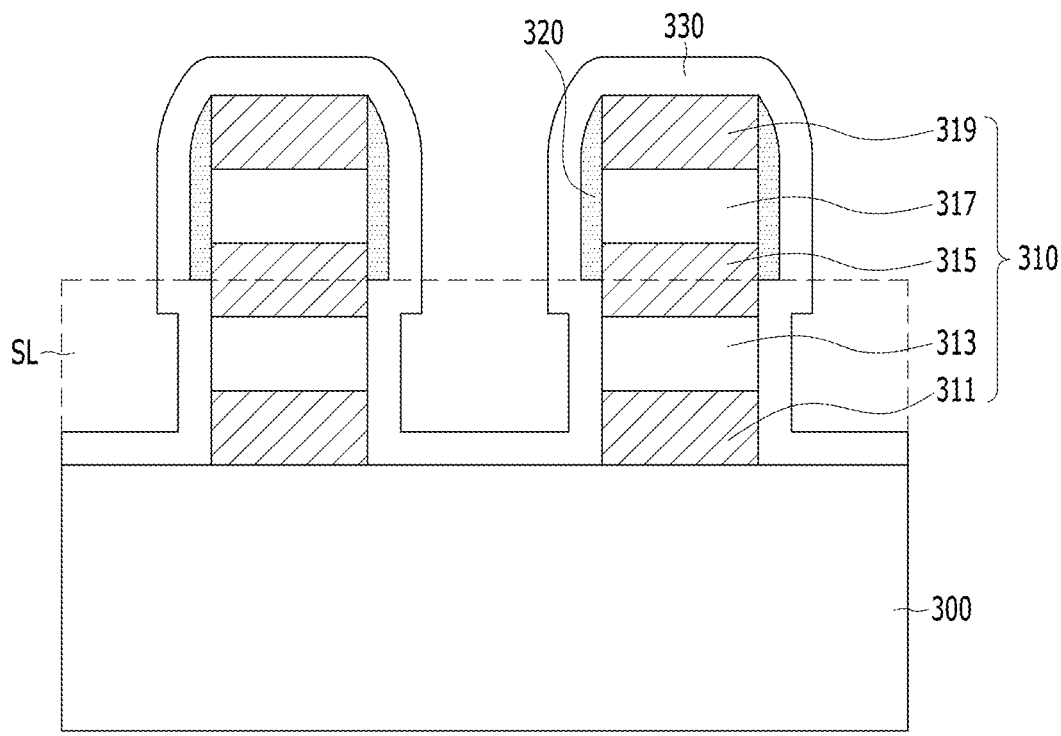
FIG. 5 is a cross-sectional view illustrating a memory device according to still another embodiment of the present disclosure.

FIG. 5 is a cross-sectional view illustrating a memory device according to still another embodiment of the present disclosure. Differences from the above-described embodiments will be mainly described.

Referring to FIG. 5, the memory device may include a substrate 300, a memory cell 310 disposed over the substrate 300, a protective layer 330 disposed over the memory cell 310, and a buffer layer 320 interposed between the protective layer 330 and a portion of a sidewall of the memory cell 310.

The memory cell 310 may include a stacked structure of a lower electrode layer 311, a variable resistance layer 313, an intermediate electrode layer 315, a selection element layer 317, and an upper electrode layer 319. That is, unlike the above-described embodiments, the selection element layer 317 may be disposed over the variable resistance layer 313.

The buffer layer 320 may be formed to cover at least a sidewall of the selection element layer 317 of the memory cell 310. In particular, the buffer layer 320 may be formed to have a spacer type and have a thickness and/or a horizontal width increasing from top to bottom while covering the sidewall of the selection element layer 317. Furthermore, the buffer layer 320 may expose or be formed not to cover a sidewall of the variable resistance layer 313.

The buffer layer 320 may be formed by forming a sacrificial layer SL having a predetermined thickness over the substrate 300 between the memory cells 310, forming a silicon nitride layer along the sacrificial layer SL and the rest of the memory cell 310 protruding from the sacrificial layer SL, and then, performing a blanket etching process on the silicon nitride layer. The silicon nitride layer may be formed by repeating the cycle of the process shown in FIG. 2. The sacrificial layer SL may have an upper surface positioned at a height lower than or equal to a lower surface of the selection element layer 317 to expose or not to cover the sidewall of the selection element layer 317. For example, as illustrated, the sacrificial layer SL may cover a sidewall of the lower electrode layer 311, the sidewall of the variable resistance layer 313, and a portion of a sidewall of the intermediate electrode layer 315.

The sacrificial layer SL may be removed after the buffer layer 320 is formed.

Because the buffer layer 320 covers at least the sidewall of the selection element layer 317, an upper end of the buffer layer 320 may be located at a height higher than or equal to an upper surface of the selection element layer 317, and a lower end of the buffer layer 320 may be located at a height lower than or equal to a lower surface of the selection element layer 317. For example, as illustrated, the buffer layer 320 may cover the rest of the sidewall of the intermediate electrode layer 315 that is not covered by the sacrificial layer SL, the sidewall of the selection element layer 317, and a sidewall of the upper electrode layer 319.

The protective layer 330 may be formed along a profile of a resultant structure in which the buffer layer 320 is formed. Accordingly, the protective layer 330 may be in direct contact with the remaining portion of the memory cell 310, which is not covered by the buffer layer 320. For example, as illustrated, the protective layer 330 may directly contact and cover a portion of the sidewall of the intermediate electrode layer 315 that is not covered by the buffer layer 320, the sidewall of the variable resistance layer 313, and the sidewall of the lower electrode layer 311.

The above and other semiconductor devices based on the disclosed technology can be used in a range of devices or systems. FIGS. 6-9 provide some examples of devices or systems that can be implemented with the semiconductor devices disclosed herein.

Figure 6:
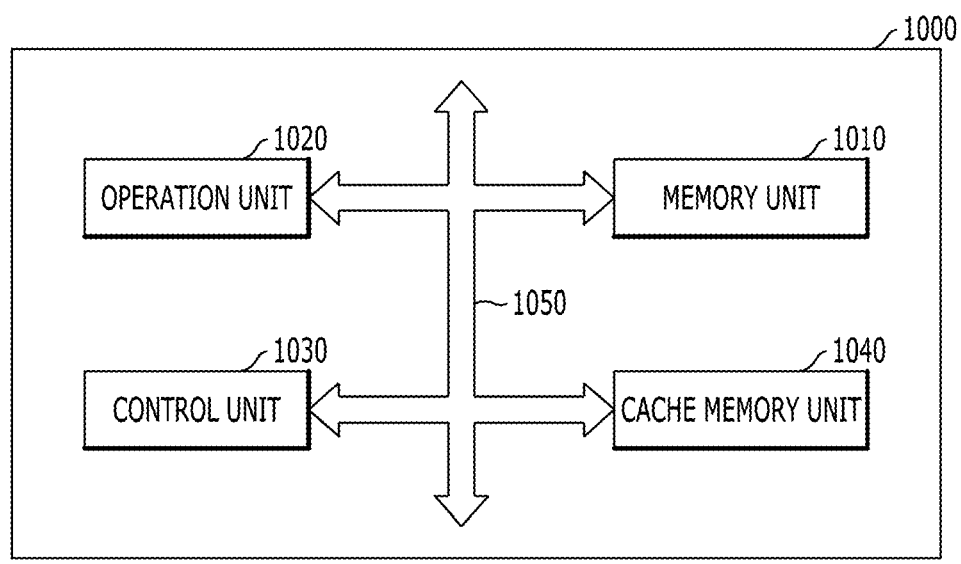
FIG. 6 illustrates a configuration diagram of a microprocessor implementing memory circuitry based on the disclosed technology.

FIG. 6 illustrates a configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include various registers such as a data register, an address register, a floating point register and so on. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the embodiments. For example, the memory unit 1010 may include a memory cell; a protective layer disposed over the memory cell; and a buffer layer interposed between at least a portion of a sidewall of the memory cell and the protective layer, wherein the buffer layer and the protective layer include silicon nitride, and wherein a density of the protective layer is greater than a density of the buffer layer. Through this, in the memory unit 101, memory cell characteristics and fabricating processes may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present embodiment may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
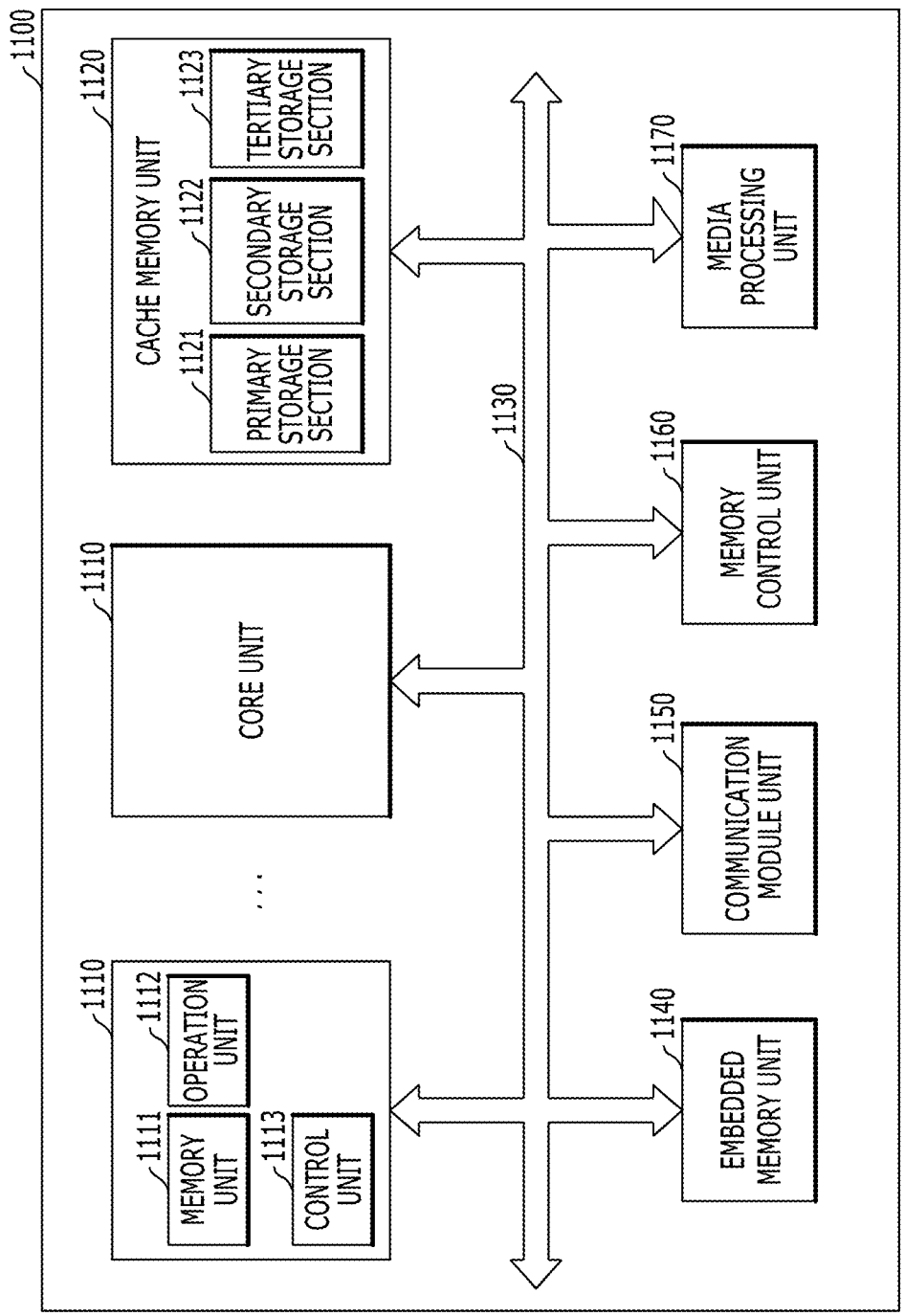
FIG. 7 illustrates a configuration diagram of a processor implementing memory circuitry based on the disclosed technology.

FIG. 7 illustrates a configuration diagram of a processor implementing memory circuitry based on the disclosed technology.

Referring to FIG. 7, a processor 1100 may improve performance and realize multi-functionality by including various functions other than those of the above-described microprocessor 1000. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present embodiment is a part which performs arithmetic logic operations for data inputted from an external device, and may include a memory unit 1111, an operation unit 1112 and a control unit 1113. The memory unit 1111, the operation unit 1112 and the control unit 1113 may be substantially the same as the memory unit 1010, the operation unit 1020 and the control unit 1030.

The cache memory unit 1120 is a part which temporarily stores data to compensate for a difference in data processing speed between the core unit 1110 operating at a high speed and an external device operating at a low speed. The cache memory unit 1120 may include a primary storage section 1121 and a secondary storage section 1122. Further, the cache memory unit 1120 may include a tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the embodiments. For example, the cache memory unit 1120 may include a memory cell; a protective layer disposed over the memory cell; and a buffer layer interposed between at least a portion of a sidewall of the memory cell and the protective layer, wherein the buffer layer and the protective layer include silicon nitride, and wherein a density of the protective layer is greater than a density of the buffer layer. Through this, memory cell characteristics and fabricating processes may be improved in the cache memory unit 1120. As a consequence, it is possible to improve operating characteristics of the processor 1100.

Although it was shown in this embodiment that all the primary, secondary and tertiary storage sections 1121, 1122 and 1123 are configured inside the cache memory unit 1120, at least one of the primary, secondary and tertiary storage sections 1121, 1122 and 1123 of the cache memory unit 1120 may be configured outside the core unit 1110 and may compensate for a difference in data processing speed between the core unit 1110 and the external device.

The bus interface 1130 is a part which connects the core unit 1110, the cache memory unit 1120 and external device and allows data to be efficiently transmitted.

The processor 1100 according to the present embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. Storage sections in each of the core units 1110 may be configured to be shared with storage sections outside the core units 1110 through the bus interface 1130.

The processor 1100 according to the present embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
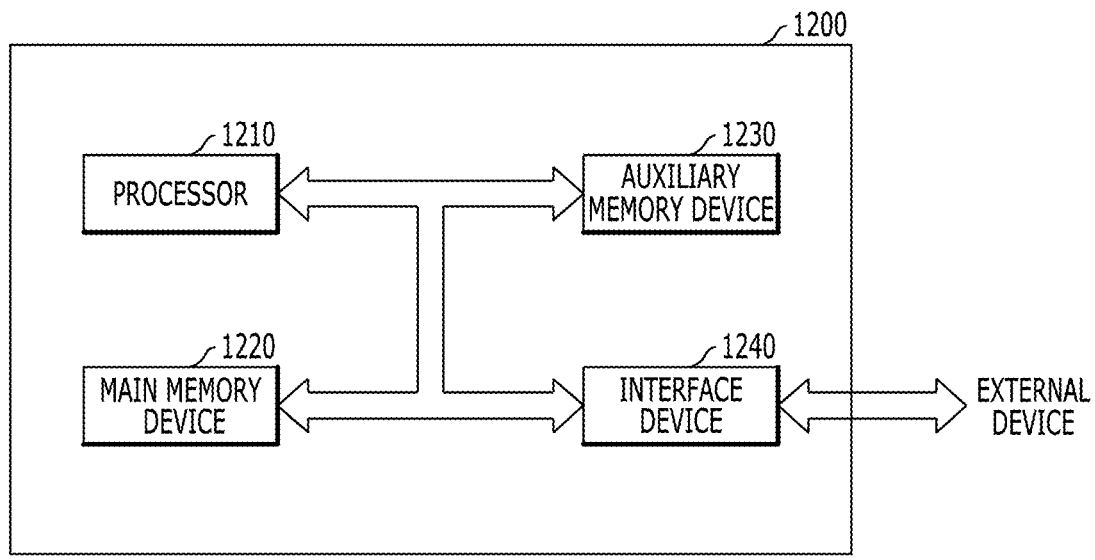
FIG. 8 illustrates a configuration diagram of a system implementing memory circuitry based on the disclosed technology.

FIG. 8 illustrates a configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may substantially the same as the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off. The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described semiconductor devices in accordance with the embodiments. For example, the main memory device 1220 or the auxiliary memory device 1230 may include a memory cell; a protective layer disposed over the memory cell; and a buffer layer interposed between at least a portion of a sidewall of the memory cell and the protective layer, wherein the buffer layer and the protective layer include silicon nitride, and wherein a density of the protective layer is greater than a density of the buffer layer. Through this, memory cell characteristics and fabricating processes may be improved in the main memory device 1220 or the auxiliary memory device 1230. As a consequence, it is possible to improve operating characteristics of the system 1200.

Also, the main memory device 1220 or the auxiliary memory device 1230 may include a memory system (see the reference numeral 1300 of FIG. 9) in addition to the above-described semiconductor device or without including the above-described semiconductor device.

The interface device 1240 may be to perform exchange of commands and data between the system 1200 of the present embodiment and an external device. The interface device 1240 may be a keypad, a keyboard, a mouse, a speaker, a mike, a display, various human interface devices (HIDs), a communication device, and so on. The communication device may be substantially the same as the above-described communication module unit 1150.

Figure 9:
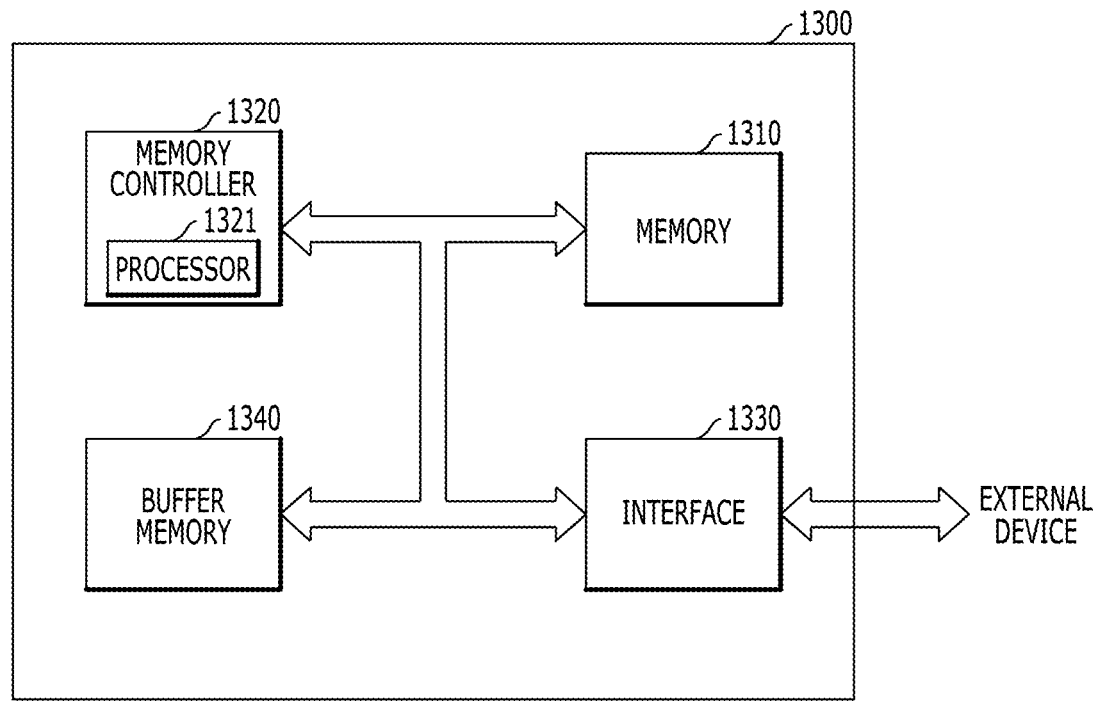
FIG. 9 illustrates a configuration diagram of a memory system implementing memory circuitry based on the disclosed technology.

FIG. 9 illustrates a configuration diagram of a memory system implementing memory circuitry based on the disclosed technology.

Referring to FIG. 9, a memory system 1300 may include a memory 1310 which has a nonvolatile characteristic as a component for storing data, a controller 1320 which controls the memory 1310, an interface 1330 for connection with an external device, and a buffer memory 1340 for storing data temporarily for efficiently transferring data between the interface 1330 and the memory 1310. The memory system 1300 may simply mean a memory for storing data, and may also mean a data storage device for conserving stored data in a long term. The memory system 1300 may be a disk type such as a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1310 or the buffer memory 1340 may include one or more of the above-described semiconductor devices in accordance with the embodiments. For example, the memory 1310 or the buffer memory 1340 may include a memory cell; a protective layer disposed over the memory cell; and a buffer layer interposed between at least a portion of a sidewall of the memory cell and the protective layer, wherein the buffer layer and the protective layer include silicon nitride, and wherein a density of the protective layer is greater than a density of the buffer layer. Through this, in the memory 1310 or the buffer memory 1340, memory cell characteristics and fabricating processes may be improved. As a consequence, it is possible to improve operating characteristics of the memory system 1300.

The memory 1310 or the buffer memory 1340 may include various memories such as a nonvolatile memory or a volatile memory, in addition to the above-described semiconductor device or without including the above-described semiconductor device.

The controller 1320 may control exchange of data between the memory 1310 and the interface 1330. To this end, the controller 1320 may include a processor 1321 for performing an operation for, processing commands inputted through the interface 1330 from an outside of the memory system 1300 and so on.

The interface 1330 is to perform exchange of commands and data between the memory system 1300 and the external device. In the case where the memory system 1300 is a card type or a disk type, the interface 1330 may be compatible with interfaces which are used in devices having a card type or a disk type, or be compatible with interfaces which are used in devices similar to the above mentioned devices. The interface 1330 may be compatible with one or more interfaces having a different type from each other.

Features in the above electronic devices or systems illustrated in FIGS. 6-9 based on the semiconductor devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any disclosure or of what may be claimed, but rather as descriptions of features that may be specific to particular embodiments of particular disclosures. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

Although various embodiments have been described for illustrative purposes, it will be apparent to those skilled in the art that various changes and modifications may be made without departing from the spirit and scope of the present teachings as defined in the following claims.

What is claimed is:

1. An electronic device comprising a semiconductor memory, the semiconductor memory comprising:
   a memory cell;

a protective layer disposed along a profile of the memory cell; and a buffer layer interposed between at least a portion of a sidewall of the memory cell and the protective layer, wherein the memory cell includes a variable resistance layer, wherein the buffer layer is disposed without covering a sidewall of the variable resistance layer, wherein the sidewall of the variable resistance layer is in direct contact with the protective layer, and wherein a density of the protective layer is greater than a density of the buffer layer.

2. The electronic device according to claim 1, wherein a number of Si—N bonds per unit volume of the protective layer is greater than a number of Si—N bonds per unit volume of the buffer layer.

3. The electronic device according to claim 1, wherein the memory cell further includes a selection element layer disposed above or below the variable resistance layer, and wherein the buffer layer covers a sidewall of the selection element layer.

4. The electronic device according to claim 1, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

5. The electronic device according to claim 1, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

6. The electronic device according to claim 1, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

7. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

8. The electronic device according to claim 1, wherein the buffer layer and the protective layer include silicon nitride.

9. An electronic device comprising a semiconductor memory, the semiconductor memory comprising:

a memory cell;

a protective layer disposed along a profile of the memory cell; and a buffer layer interposed between at least a portion of a sidewall of the memory cell and the protective layer, wherein the memory cell includes a variable resistance layer, wherein the buffer layer is disposed without covering a sidewall of the variable resistance layer, wherein the sidewall of the variable resistance layer is in direct contact with the protective layer, and wherein the buffer layer and the protective layer have compressive stress.

10. An electronic device comprising a semiconductor memory, the semiconductor memory comprising:

a memory cell;

a protective layer disposed along a profile of the memory cell; and a buffer layer interposed between at least a portion of a sidewall of the memory cell and the protective layer, wherein the memory cell includes a variable resistance layer, wherein the buffer layer is disposed without covering a sidewall of the variable resistance layer, wherein the sidewall of the variable resistance layer is in direct contact with the protective layer, and wherein the buffer layer includes a stacked structure of first to Nth silicon nitride layers, where N is a natural number equal to or greater than 2.

11. The electronic device according to claim 10, wherein each of the first to Nth silicon nitride layers includes a first portion closer to the memory cell than to the protective layer and a second portion closer to the protective layer than to the memory cell, and wherein a density of the second portion is greater than a density of the first portion.

12. The electronic device according to claim 11, wherein a number of Si—N bonds per unit volume of the second portion is greater than a number of Si—N bonds per unit volume of the first portion.

13. The electronic device according to claim 11, wherein the first portion has tensile stress and the second portion has compressive stress.

14. The electronic device according to claim 11, wherein a thickness of the second portion is greater than a thickness of the first portion.

15. The electronic device according to claim 10, wherein the first silicon nitride layer has a smaller density than each of the second to Nth silicon nitride layers, the first silicon nitride layer rather than the second to Nth silicon nitride layers being closer to the memory cell.

16. The electronic device according to claim 15, wherein a number of Si—N bonds per unit volume of the first silicon nitride layer is smaller than a number of Si—N bonds per unit volume of each of the second to Nth silicon nitride layers.

17. The electronic device according to claim 15, wherein the first silicon nitride layer has tensile stress, and each of the second to Nth silicon nitride layers has compressive stress.

18. The electronic device according to claim 15, wherein each of the second to Nth silicon nitride layers includes a first portion closer to the memory cell than to the protective layer and a second portion closer to the protective layer than to the memory cell,
wherein a density of the second portion is greater than a density of the first portion, and
wherein the density of the first portion is the same as the density of the first silicon nitride layer.

19. The electronic device according to claim 18, wherein a number of Si—N bonds per unit volume of the second portion is greater than a number of Si—N bonds per unit volume of the first portion, and
wherein the number of Si—N bonds per unit volume of the first portion is the same as the number of Si—N bonds per unit volume of the first silicon nitride layer.

20. The electronic device according to claim 18, wherein the first portion and the first silicon nitride layer have tensile stress and the second portion has compressive stress.

21. A method for fabricating an electronic device comprising a semiconductor memory, the method comprising:
forming a memory cell over a substrate;
forming a buffer layer over at least a portion of a sidewall of the memory cell; and
forming a protective layer along a profile of the memory cell on which the buffer layer is formed,
wherein the buffer layer and the protective layer include silicon nitride,
wherein the forming of the buffer layer is performed using a silicon source gas including $SiH_4$ gas and a reactive gas including nitrogen, and
wherein a density of the protective layer is greater than a density of the buffer layer.

22. The method according to claim 21, wherein the forming of the buffer layer comprises:
forming an initial silicon nitride layer using the silicon source gas including the $SiH_4$ gas and the reactive gas including nitrogen; and
performing a plasma treatment on the initial silicon nitride layer with a gas containing nitrogen and a light element.

23. The method according to claim 22, wherein the light element includes He.

24. The method according to claim 22, wherein the forming of the initial silicon nitride layer and the performing of the plasma treatment are performed in situ.

25. The method according to claim 22, wherein the forming of the initial silicon nitride layer and the performing of the plasma treatment are repeated N times, where N is a natural number of 2 or more.

26. The method according to claim 22, wherein, in the plasma treatment, at least one of a density and a number of Si—N bonds per unit volume of at least a portion of the initial silicon nitride layer increases.

27. The method according to claim 22, wherein, in the plasma treatment, tensile stress of at least a portion of the initial silicon nitride layer is changed into compressive stress.

28. A method for fabricating an electronic device comprising a semiconductor memory, the method comprising:
forming a memory cell over a substrate;
forming a buffer layer over at least a portion of a sidewall of the memory cell; and
forming a protective layer along a profile of the memory cell on which the buffer layer is formed,
wherein the buffer layer and the protective layer include silicon nitride,
wherein the forming of the protective layer is performed using a silicon source gas including $SiH_2I_2$ gas and a reactive gas containing nitrogen.

29. The method according to claim 28, wherein a density of the protective layer is greater than a density of the buffer layer.

* * * * *